(12) United States Patent
Wu (10) Patent No.: US 11,195,859 B2
(45) Date of Patent: Dec. 7, 2021

(54) ARRAY SUBSTRATE AND FLEXIBLE DISPLAY PANEL (71) Applicant: WUHAN CHINA STAR OPTOELECTRONICS SEMICONDUCTOR DISPLAY TECHNOLOGY CO., LTD., Hubei (CN)

(72) Inventor: Shaojing Wu, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 58 days.

(21) Appl. No.: 16/770,769

(22) PCT Filed: Feb. 13, 2020

(86) PCT No.: PCT/CN2020/075077
§ 371 (c)(1),
(2) Date: Jun. 8, 2020

(87) PCT Pub. No.: WO2021/114473
PCT Pub. Date: Jun. 17, 2021

(65) Prior Publication Data
US 2021/0175257 A1 Jun. 10, 2021

(51) Int. Cl.
H01L 27/12 (2006.01)
G06F 1/16 (2006.01)
H01L 51/00 (2006.01)

(52) U.S. Cl.
CPC ........ *H01L 27/1218* (2013.01); *H01L 27/124* (2013.01); *H01L 27/1248* (2013.01); *G06F 1/1641* (2013.01); *G06F 1/1652* (2013.01); *H01L 51/0097* (2013.01); *H01L 2251/5338* (2013.01)

(58) Field of Classification Search
CPC .............. H01L 27/1218; H01L 27/124; H01L 27/1248; H01L 51/0097; H01L 2251/5338; G06F 1/1641; G06F 1/1652
See application file for complete search history.

(56) References Cited

U.S. PATENT DOCUMENTS

2013/0258265 A1* 10/2013 Liu .................... G02F 1/133345
349/139
2014/0159010 A1* 6/2014 Song ................... H01L 27/3265
257/40

(Continued)

*Primary Examiner* — Mohsen Ahmadi
(74) *Attorney, Agent, or Firm* — The Roy Gross Law Firm, LLC; Roy Gross (57) ABSTRACT

An array substrate and a flexible display panel are provided. The array substrate is in a bending region and includes a base; an inorganic layer formed on the base, wherein at least one hollowing-out region is disposed in the inorganic layer, and the hollowing-out region is non-filled or filled with an organic matter; and a metal layer formed on the inorganic layer and connected to layers on a bottom of the inorganic layer by at least one via hole encircled by the at least one hollowing-out region. When the flexible display panel is bent, the at least one hollowing-out region provides a good channel for releasing stress in the inorganic layer and improves the bending performance of the flexible display panel.

10 Claims, 8 Drawing Sheets (56) References Cited

U.S. PATENT DOCUMENTS

| | | | |
|---|---|---|---|
| 2016/0148981 A1* | 5/2016 | Matsueda | H01L 51/0011 |
| | | | 257/40 |
| 2018/0006267 A1* | 1/2018 | Sakamoto | H01L 51/5253 |
| 2019/0027543 A1* | 1/2019 | Zhang | H01L 27/3283 |
| 2019/0123069 A1* | 4/2019 | Yang | H01L 29/66969 |
| 2019/0148474 A1* | 5/2019 | Bu | H01L 27/3276 |
| | | | 257/40 |
| 2020/0012369 A1* | 1/2020 | Guo | H01L 27/3225 |
| 2020/0152901 A1* | 5/2020 | Liu | H01L 27/3218 |
| 2020/0176722 A1* | 6/2020 | Lu | H01L 51/56 |
| 2020/0185423 A1* | 6/2020 | Hu | H01L 27/127 |
| 2020/0212326 A1* | 7/2020 | Eom | H01L 51/5237 |
| 2021/0183974 A1* | 6/2021 | Peng | H01L 27/3258 |

\* cited by examiner

ARRAY SUBSTRATE AND FLEXIBLE DISPLAY PANEL

FIELD OF INVENTION

The present disclosure relates to the field of display panels, and particularly relates to an array substrate and a flexible display panel.

BACKGROUND OF INVENTION

Because flexible display panels have characteristics such as flexibility, bendability, wearability, etc., they have become a new generation display technology.

However, in current flexible display panel technologies, there are many inorganic film layers with poor bending resistance. It is difficult for stress in the inorganic film layers to be released when trying to realize dynamic folding. Fragmentation or cracks easily occur during a bending process, and the cracks easily extend along the inorganic film layers, causing a structure of an entire panel to be damaged and leading to poor display.

Therefore, current flexible display panels have a problem of poor bending reliability, which needs to be solved.

SUMMARY OF INVENTION

The present disclosure provides an array substrate and a flexible display panel to ease the problem of current flexible display panels having poor bending reliability.

In order to solve the problem mentioned above, the present disclosure provides following technical solutions:

The present disclosure provides an array substrate, and the array substrate is in a bending region and includes:
  a base;
  an inorganic layer formed on the base, wherein at least one hollowing-out region is disposed in the inorganic layer, and the at least one hollowing-out region is non-filled or filled with an organic matter; and
  a metal layer formed on the inorganic layer and is connected to layers on a bottom of the inorganic layer by at least one via hole encircled by the at least one hollowing-out region.

In the array substrate provided by the present disclosure, the inorganic layer only includes only one layer.

In the array substrate provided by the present disclosure, the inorganic layer is any layer of a first gate insulating layer, a second gate insulating layer, or an interlayer insulation layer, and the metal layer is a source/drain electrode layer.

In the array substrate provided by the present disclosure, the inorganic layer is a passivation layer, and the metal layer is a pixel electrode layer.

In the array substrate provided by the present disclosure, the inorganic layer includes at least two layers.

In the array substrate provided by the present disclosure, the inorganic layer includes a first gate insulating layer, a second gate insulating layer, and an interlayer insulation layer, and the metal layer is a source/drain electrode layer.

In the array substrate provided by the present disclosure, the inorganic layer includes a first inorganic layer and a second inorganic layer, and the metal layer includes a first metal layer and a second metal layer, the first metal layer, the second inorganic layer, and the second metal layer are sequentially formed on the first inorganic layer. The first inorganic layer is any layer of a first gate insulating layer, a second gate insulating layer, or an interlayer insulation layer. The first metal layer is a source/drain electrode layer. The second inorganic layer is a passivation layer. The second metal layer is a pixel electrode layer.

In the array substrate provided by the present disclosure, the inorganic layer includes a first gate insulating layer, a second gate insulating layer, and an interlayer insulation layer, and the metal layer is a source/drain electrode layer.

In the array substrate provided by the present disclosure, the inorganic layer includes a first inorganic layer and a second inorganic layer, the metal layer comprises a first metal layer and a second metal layer, the first metal layer, the second inorganic layer, and the second metal layer are sequentially formed on the first inorganic layer, the first inorganic layer comprises any two of a first gate insulating layer, a second gate insulating layer, or an interlayer insulation layer, the first metal layer is a source/drain electrode layer, the second inorganic layer is a passivation layer, and the second metal layer is a pixel electrode layer.

In the array substrate provided by the present disclosure, the inorganic layer includes a first inorganic layer and a second inorganic layer, and the metal layer includes a first metal layer and a second metal layer. The first metal layer, the second inorganic layer, and the second metal layer are sequentially formed on the first inorganic layer. The first inorganic layer includes a first gate insulating layer, a second gate insulating layer, and an interlayer insulation layer. The first metal layer is a source/drain electrode layer. The second inorganic layer is a passivation layer. The second metal layer is a pixel electrode layer.

Meanwhile, the present disclosure provides a flexible display panel. The flexible display panel includes an array substrate, and the array substrate is in a bending region and includes:
  a base;
  an inorganic layer formed on the base, wherein at least one hollowing-out region is disposed in the inorganic layer, and the at least one hollowing-out region is non-filled or filled with an organic matter; and
  a metal layer formed on the inorganic layer and is connected to layers on bottom of the inorganic layer by at least one via hole encircled by the at least one hollowing-out region.

In the flexible display panel provided by the present disclosure, the inorganic layer includes only one layer.

In the flexible display panel provided by the present disclosure, the inorganic layer is any layer of a first gate insulating layer, a second gate insulating layer, or an interlayer insulation layer, and the metal layer is a source/drain electrode layer.

In the flexible display panel provided by the present disclosure, the inorganic layer is a passivation layer, and the metal layer is a pixel electrode layer.

In the flexible display panel provided by the present disclosure, the inorganic layer includes at least two layers.

In the flexible display panel provided by the present disclosure, the inorganic layer comprises any two of a first gate insulating layer, a second gate insulating layer, and an interlayer insulation layer, and the metal layer is a source/drain electrode layer.

In the flexible display panel provided by the present disclosure, the inorganic layer includes a first inorganic layer and a second inorganic layer, and the metal layer includes a first metal layer and a second metal layer, the first metal layer, the second inorganic layer. The second metal layer are sequentially formed on the first inorganic layer. The first inorganic layer is any layer of a first gate insulating layer, a second gate insulating layer, or an interlayer insulation layer.

The first metal layer is a source/drain electrode layer. The second inorganic layer is a passivation layer. The second metal layer is a pixel electrode layer.

In the flexible display panel provided by the present disclosure, the inorganic layer comprises a first gate insulating layer, a second gate insulating layer, and an interlayer insulation layer, and the metal layer is a source/drain electrode layer.

In the flexible display panel provided by the present disclosure, the inorganic layer includes a first inorganic layer and a second inorganic layer, the metal layer comprises a first metal layer and a second metal layer, the first metal layer, the second inorganic layer, and the second metal layer are sequentially formed on the first inorganic layer, the first inorganic layer comprises any two of a first gate insulating layer, a second gate insulating layer, and an interlayer insulation layer, the first metal layer is a source/drain electrode layer, the second inorganic layer is a passivation layer, and the second metal layer is a pixel electrode layer.

In the flexible display panel provided by the present disclosure, the inorganic layer includes a first inorganic layer and a second inorganic layer, and the metal layer includes a first metal layer and a second metal layer. The first metal layer, the second inorganic layer, and the second metal layer are sequentially formed on the first inorganic layer. The first inorganic layer includes a first gate insulating layer, a second gate insulating layer, and an interlayer insulation layer. The first metal layer is a source/drain electrode layer. The second inorganic layer is a passivation layer. The second metal layer is a pixel electrode layer.

The present disclosure provides an array substrate and a flexible display panel. The array substrate is in a bending region and includes a base; an inorganic layer formed on the base, wherein at least one hollowing-out region is disposed in the inorganic layer, and the at least one hollowing-out region is non-filled or filled with an organic matter; and a metal layer formed on the inorganic layer and connected to layers on a bottom of the inorganic layer by at least one via hole encircled by the at least one hollowing-out region. By disposing the hollowing-out region in the inorganic layer, and the at least one hollowing-out region is non-filled or filled with an organic matter, when the flexible display panel is bent, the at least one hollowing-out region provides a good channel for releasing stress in the inorganic layer, which prevents a problem of fragmentation and cracks from occurring in the inorganic layer incurred by stress unable to be released timely, resulting in damage to a structure of an entire panel, as well as improves a bending performance of the flexible display panel.

DESCRIPTION OF DRAWINGS

The technical solutions and other advantageous effects of the present invention will be apparent with reference to the following accompanying drawings and detailed description of embodiments of the present disclosure.

DETAILED DESCRIPTION OF PREFERRED EMBODIMENTS

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., only refer to directions of the accompanying figures. Therefore, the used directional terms are for illustrating and understanding the present disclosure, but not for limiting the present disclosure. In the figures, units with similar structures are indicated by the same reference numerals.

Aimed at a problem that current flexible display panels have poor bending reliability, the present disclosure provides an array substrate which can ease this problem.

In an embodiment, please refer to FIG. 1 to FIG. 15, the array substrate 10 provided by the present disclosure includes a bending region 100 and a non-bending region 200. In the bending region 100, the array substrate 10 includes:

a base;

an inorganic layer formed on the base, wherein at least one hollowing-out region is disposed in the inorganic layer, and the at least one hollowing-out region is non-filled or filled with an organic matter; and a metal layer formed on the inorganic layer and connected to layers on a bottom of the inorganic layer by at least one via hole encircled by the at least one hollowing-out region.

An embodiment of the present disclosure provides the array substrate. The array substrate is provided with the hollowing-out region in the inorganic layer of the bending region, and the hollowing-out region is non-filled or filled with an organic matter. When the flexible display panel is bent, the at least one hollowing-out region provides a good channel for releasing stress in the inorganic layer, which prevents the problem of fragmentation and cracks from occurring in the inorganic layer incurred by stress unable to be released timely, resulting in damage to the structure of the entire panel, as well as improves the bending performance of the flexible display panel.

In an embodiment, as illustrated in FIG. 1 to FIG. 15, the array substrate 10 provided by embodiments of the present disclosure specifically includes:

The base 101 includes a flexible base 1011, a barrier layer 1012, and a buffer layer 1013. A material of the flexible base 1011 is generally an organic polymer material such as polyacetamide, polyethylene terephthalate, etc. A material of the barrier layer 1012 is generally silica for blocking environmental impurity particles from entering the substrate and isolating water/oxygen. A laminated structure of silicon nitride (SiNx) and silica (SiOx) is generally used for the barrier layer 1013. The silicon nitride has great ion isolating ability and great water/oxygen isolating ability, which can effectively prevent impurities from diffusing to the thin film transistor during a heating process. The interface wettability between silicon oxide and polysilicon is great, so it is good for being used as a base material for forming an active layer.

The active layer 102 is formed on the base 101 and is patterned to form an active region. The active region includes a doping region and a channel region. A material of the active layer 102 is generally amorphous silicon or polycrystalline silicon.

A first gate insulating layer 103 is formed on the active layer 102 and covers the base 101 and the active layer 102. A material of the first gate insulating layer 103 is silica. Surfaces of the silica and polycrystalline silicon have good matching of grain boundary, matching of stress, and step coverage.

A first gate electrode layer 104 is formed on the first gate insulating layer 103 and is patterned to form a first gate electrode pattern. A material of the first gate electrode layer 104 is a metal of molybdenum (Mo).

A second gate insulating layer 105 is formed on the first gate electrode layer 104 and covers the first gate insulating layer 103 and the first gate electrode layer 104. A material of the second gate insulating layer 105 is silicon nitride.

A second gate electrode layer 106 is formed on the second gate insulating layer 105 and is patterned to form a second gate electrode pattern. A material of the second gate electrode layer 106 is a metal of molybdenum (Mo).

An interlayer insulation layer 107 is formed on the second gate electrode layer 106 and covers the second gate insulating layer 105 and the second gate electrode layer 106. The interlayer insulation layer 107 is generally a laminated structure of silicon nitride (SiNx) and silica (SiOx).

A source/drain electrode layer 108 formed on the interlayer insulation layer 107 is respectively connected to the active layer 102, the first gate electrode layer 104, and the second gate electrode layer 106 through via holes, and is patterned to form a source electrode and a drain electrode. The source/drain electrode layer 108 is generally a laminated structure of metal of titanium (Ti)/aluminum (Al)/titanium (Ti).

A passivation layer 109 is formed on the source/drain electrode layer 108 and covers the source/drain electrode layer 108 and the interlayer insulation layer 107. A material of the passivation layer is generally silicon nitride (SiNx).

A pixel electrode layer 110 is formed on the passivation layer 109 and is connected to the source electrode and the drain electrode through the via holes. A material of the pixel electrode layer 110 is generally indium tin oxide (ITO).

The inorganic layer of the present disclosure disposed with the at least one hollowing-out region can include only one layer.

Figure 1:
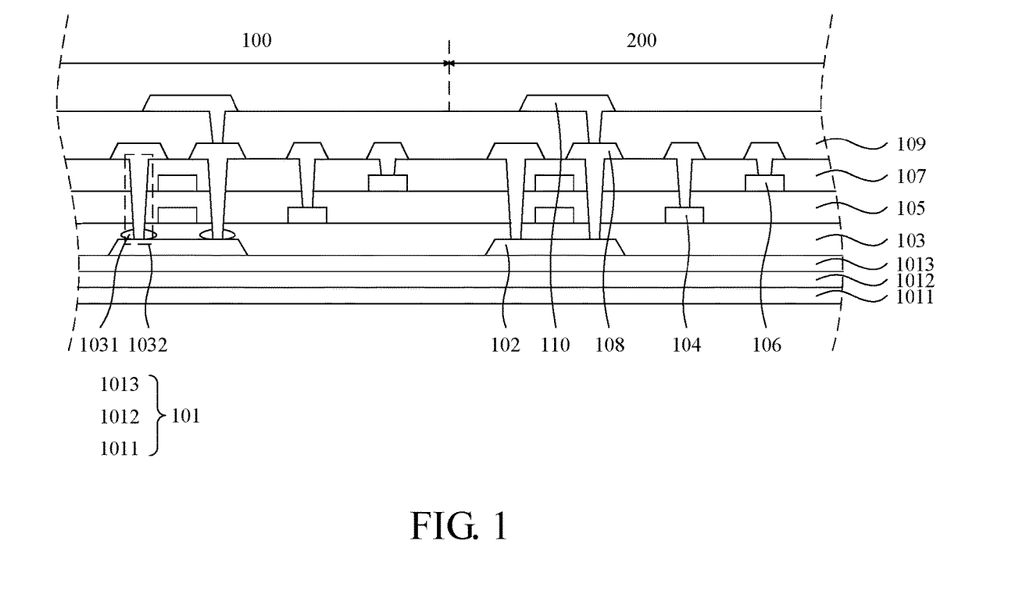
FIG. 1 is a first structural schematic diagram of an array substrate provided by an embodiment of the present disclosure.

In an embodiment, the hollowing-out region is only disposed in the first gate insulating layer 103. As illustrated in FIG. 1, the at least one hollowing-out region 1031 is disposed in the first gate insulating layer 103. The first hollowing-out region 1031 encircles a first via hole 1032. A periphery of the first hollowing-out region 1031 is a concave curved surface. A diameter of the periphery of the first hollowing-out region 1031 is greater than a diameter of the first via hole 1032 in the first gate electrode layer 103. An inner circumference of the first hollowing-out region 1031 overlaps with the periphery of the first via hole 1032 in the first gate electrode layer 103. The source/drain electrode layer 108 is connected to the active layer 102 through the first via hole 1032.

This embodiment provides the hollowing-out region in the inorganic layer. When the flexible display panel is bent, the hollowing-out region provides a good channel for releasing stress in the inorganic layer, which prevents the problem of fragmentation and cracks from occurring in the inorganic layer incurred by the stress unable to be released timely, resulting in damage to the structure of the entire panel, as well as improves the bending performance of the flexible display panel.

Figure 2:
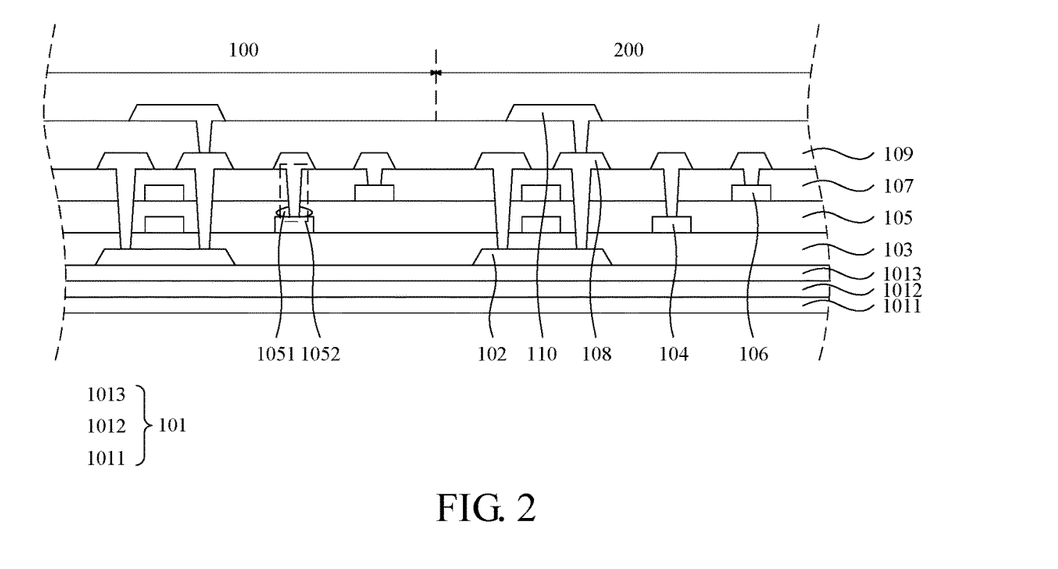
FIG. 2 is a second structural schematic diagram of the array substrate provided by an embodiment of the present disclosure.

In another embodiment, the hollowing-out region is disposed in the second gate insulating layer 105. As illustrated in FIG. 2, a second hollowing-out region 1051 is disposed in the second gate insulating layer 105. The second hollowing-out region 1051 encircles a second via hole 1052. A periphery of the second hollowing-out region 1051 is a concave curved surface. A diameter of the periphery of the second hollowing-out region 1051 is greater than a diameter of the second via hole 1052 in the second gate insulating layer 105. An inner circumference of the second hollowing-out region 1051 overlaps with the periphery of the second via hole 1052 in the second gate insulating layer 105. The source/drain electrode layer 108 is connected to the first gate electrode layer 104 through the second via hole 1052.

This embodiment provides the hollowing-out region in the second gate insulating layer. When the flexible display panel is bent, the hollowing-out region provides a good channel for releasing stress in the second gate insulating layer, which prevents the problem of fragmentation and cracks from occurring in the second gate insulating layer incurred by the stress unable to be released timely, resulting in damage to the structure of the entire panel, as well as improves the bending performance of the flexible display panel.

Figure 3:
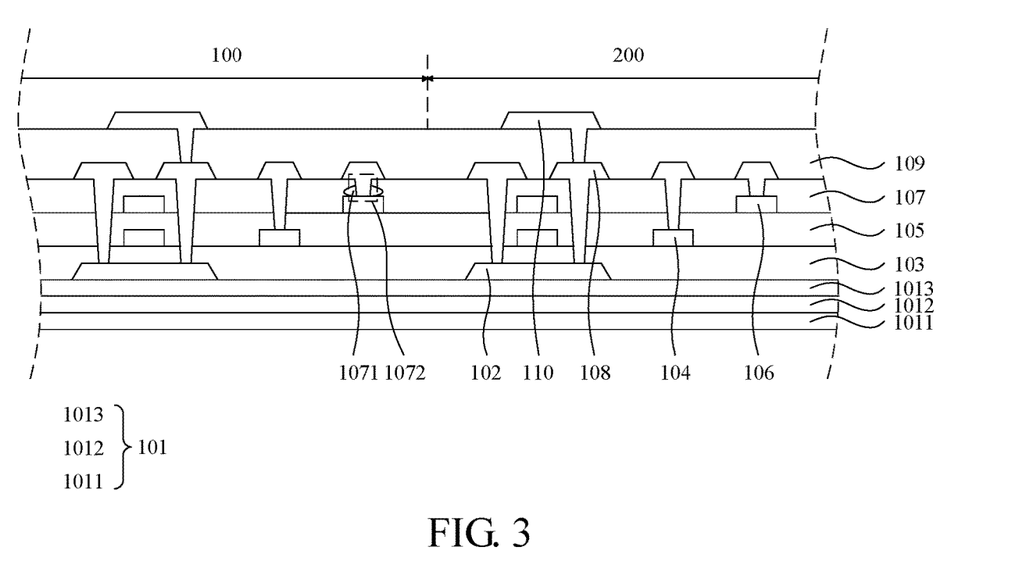
FIG. 3 is a third structural schematic diagram of the array substrate provided by an embodiment of the present disclosure.

In another embodiment, the hollowing-out region is only disposed in the interlayer insulation layer 107. As illustrated in FIG. 3, the first hollowing-out region 1031 is disposed in the interlayer insulation layer 107. A third hollowing-out region 1071 encircles a third via hole 1072. A periphery of the third hollowing-out region 1071 is a concave curved surface. A diameter of the periphery of the third hollowing-out region 1071 is greater than a diameter of the third via hole 1072 in the interlayer insulation layer 107. An inner circumference of the third hollowing-out region 1071 overlaps with the periphery of the third via hole 1072 in the interlayer insulation layer 107. The source/drain electrode layer 108 is connected to the second gate electrode layer 106 through the third via hole 1072.

This embodiment provides the hollowing-out region in the interlayer insulation layer. When the flexible display panel is bent, the hollowing-out region provides a good channel for releasing stress in the interlayer insulation layer, which prevents the problem of fragmentation and cracks from occurring in the interlayer insulation layer incurred by the stress unable to be released timely, resulting in damage to the structure of the entire panel, as well as improves the bending performance of the flexible display panel.

Figure 4:
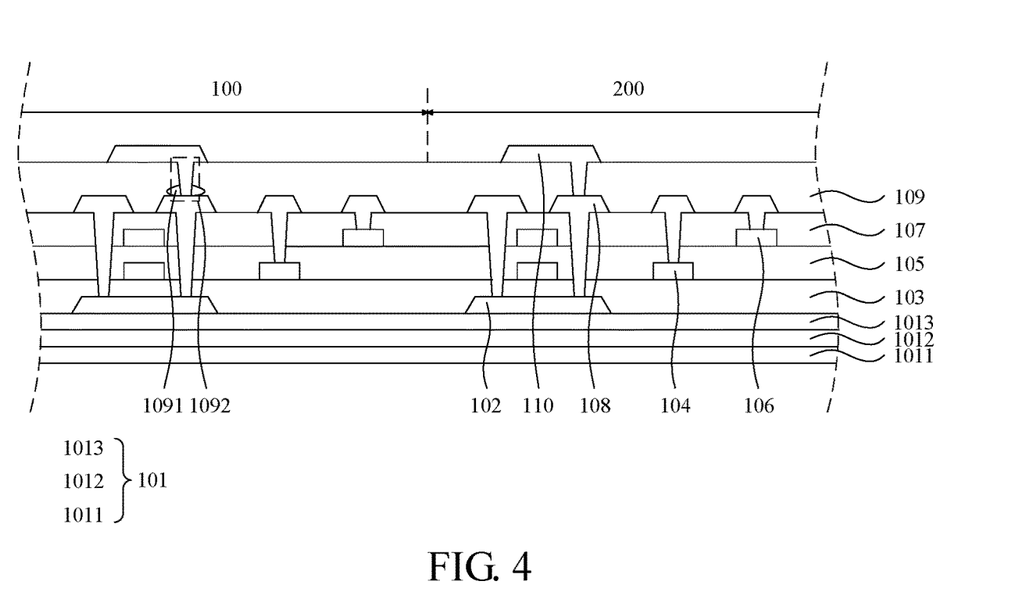
FIG. 4 is a fourth structural schematic diagram of the array substrate provided by an embodiment of the present disclosure.

In another embodiment, the hollowing-out region is only disposed in the passivation layer 109. As illustrated in FIG. 4, a fourth hollowing-out region 1091 is disposed in the passivation layer 109. The fourth hollowing-out region 1091 encircles a fourth via hole 1092. A periphery of the fourth hollowing-out region 1091 is a concave curved surface. A diameter of the periphery of the fourth hollowing-out region 1091 is greater than a diameter of the fourth via hole 1092 in the passivation layer 109. An inner circumference of the fourth hollowing-out region 1091 overlaps with the periphery of the fourth via hole 1092 in the passivation layer 109. The source/drain electrode layer 108 is connected to the source/drain electrode layer 108 through the fourth via hole 1092.

This embodiment provides the hollowing-out region in the passivation layer. When the flexible display panel is bent, the hollowing-out region provides a good channel for releasing stress in the passivation layer, which prevents the problem of fragmentation and cracks from occurring in the passivation layer incurred by the stress unable to be released timely, resulting in damage to the structure of the entire panel, as well as improves the bending performance of the flexible display panel.

The inorganic layer of the present disclosure disposed with a hollowing-out region can further include two layers.

Figure 5:
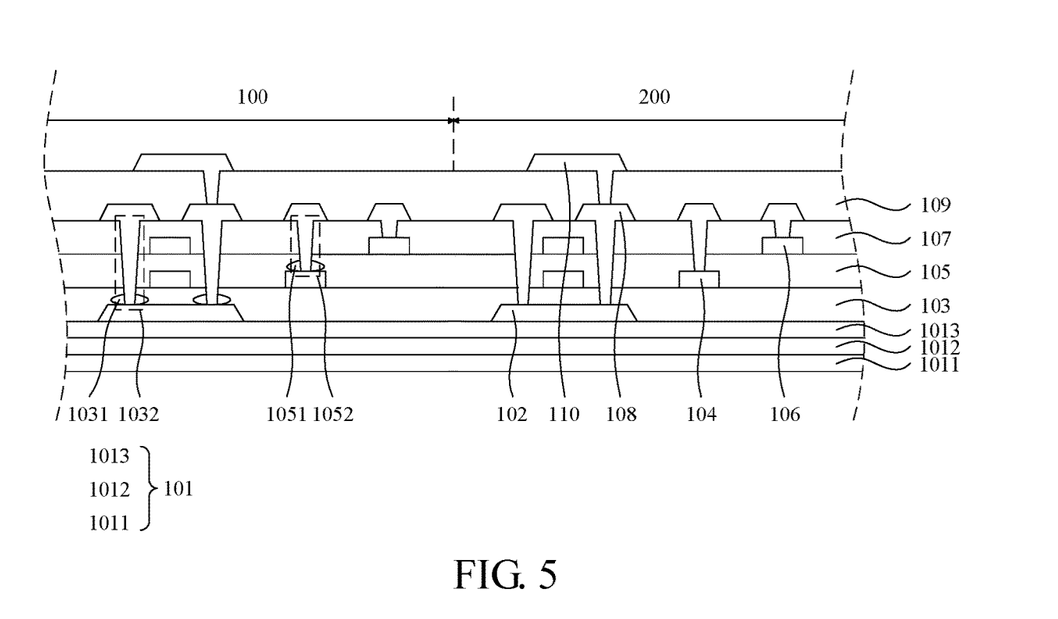
FIG. 5 is a fifth structural schematic diagram of the array substrate provided by an embodiment of the present disclosure.

In an embodiment, the hollowing-out regions are disposed in the first gate insulating layer 103 and the second gate insulating layer 105. As illustrated in FIG. 5, the first hollowing-out region 1031 is disposed in the first gate insulating layer 103, and the second hollowing-out region 1051 is disposed in the second gate insulating layer 105. The first hollowing-out region 1031 encircles the first via hole 1032, and the second hollowing-out region 1051 encircles the second via hole 1052. The source/drain electrode layer 108 is connected to the active layer 102 through the first via hole 1032 and is connected to the first gate electrode layer 104 through the second via hole 1052.

This embodiment provides the hollowing-out regions in the first gate insulating layer and the second gate insulating layer at the same time. When the flexible display panel is bent, the hollowing-out region in the first gate insulating layer provides a good channel for releasing stress in the first gate insulating layer, and the hollowing-out region in the second gate insulating layer provides a good channel for releasing stress in the second gate insulating layer, which prevent the problem of fragmentation and cracks from occurring in the first gate insulating layer or the second gate insulating layer incurred by the stress unable to be released timely, resulting in damage to the structure of the entire panel, as well as improve the bending performance of the flexible display panel.

Figure 6:
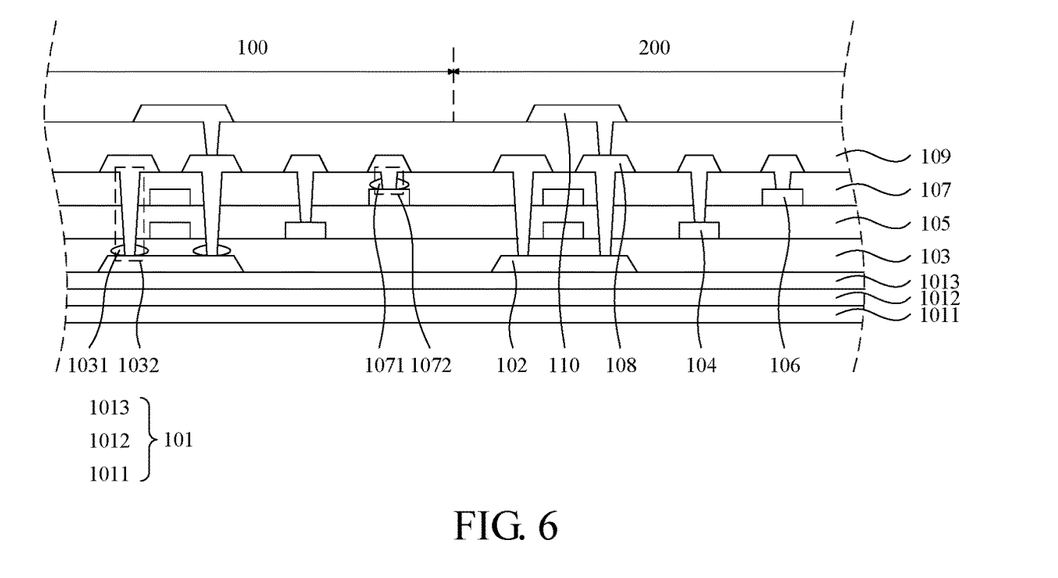
FIG. 6 is a sixth structural schematic diagram of the array substrate provided by an embodiment of the present disclosure.

In an embodiment, the at least one hollowing-out region is disposed in the first gate insulating layer 103 and the interlayer insulation layer 107. As illustrated in FIG. 6, the first hollowing-out region 1031 is disposed in the first gate insulating layer 103, and the third hollowing-out region 1071 is disposed in the interlayer insulation layer 107. The first hollowing-out region 1031 encircles the first via hole 1032, and the third hollowing-out region 1071 encircles the third via hole 1072. The source/drain electrode layer 108 is connected to the active layer 102 through the first via hole 1032 and is connected to the second gate electrode layer 106 through the third via hole 1072.

This embodiment provides the hollowing-out regions in the first gate insulating layer and the interlayer insulation layer. When the flexible display panel is bent, the hollowing-out region in the first gate insulating layer provides a good channel for releasing stress in the first gate insulating layer, and the hollowing-out region in the interlayer insulation layer provides a good channel for releasing stress in the interlayer insulation layer, which prevent the problem of fragmentation and cracks from occurring in the first gate insulating layer or the interlayer insulation layer incurred by the stress unable to be released timely, resulting in damage to the structure of the entire panel, as well as improve the bending performance of the flexible display panel.

Figure 7:
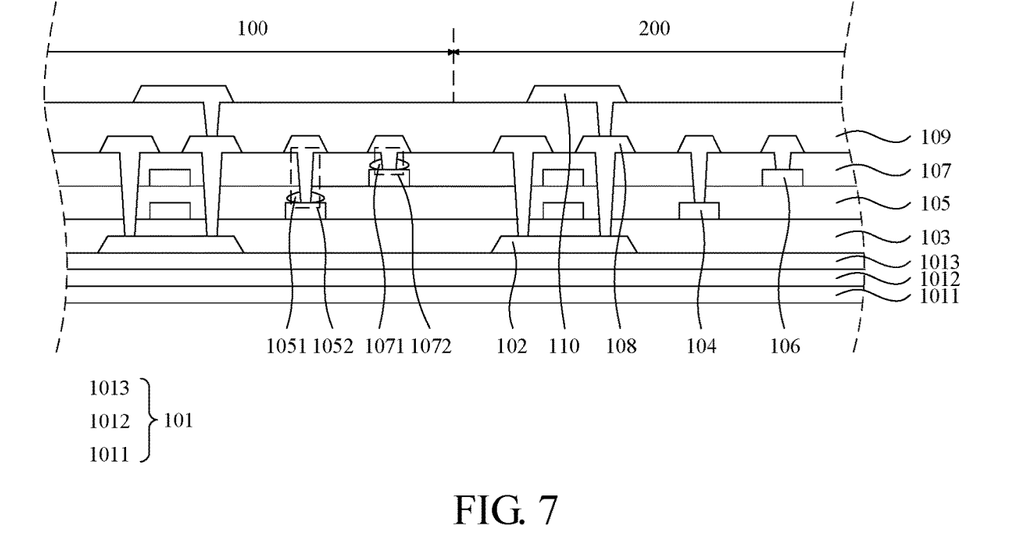
FIG. 7 is a seventh structural schematic diagram of the array substrate provided by an embodiment of the present disclosure.

In an embodiment, the hollowing-out regions are disposed in the second gate insulating layer 105 and the interlayer insulation layer 107. As illustrated in FIG. 7, the second hollowing-out region 1051 is disposed in the second gate insulating layer 105, and the third hollowing-out region 1071 is disposed in the interlayer insulation layer 107. The second hollowing-out region 1051 encircles the second via hole 1052, and the third hollowing-out region 1071 encircles the third via hole 1072. The source/drain electrode layer 108 is connected to the first gate electrode layer 104 through the second via hole 1052 and is connected to the second gate electrode layer 106 through the third via hole 1072.

This embodiment provides the hollowing-out regions in the second gate insulating layer and the interlayer insulation layer. When the flexible display panel is bent, the hollowing-out region in the second gate insulating layer provides a good channel for releasing stress in the second gate insulating layer, and the hollowing-out region in the interlayer insulation layer provides a good channel for releasing stress in the interlayer insulation layer, which prevent the problem of fragmentation and cracks from occurring in the second gate insulating layer or the interlayer insulation layer incurred by the stress unable to be released timely, resulting in damage to the structure of the entire panel, as well as improve the bending performance of the flexible display panel.

Figure 8:
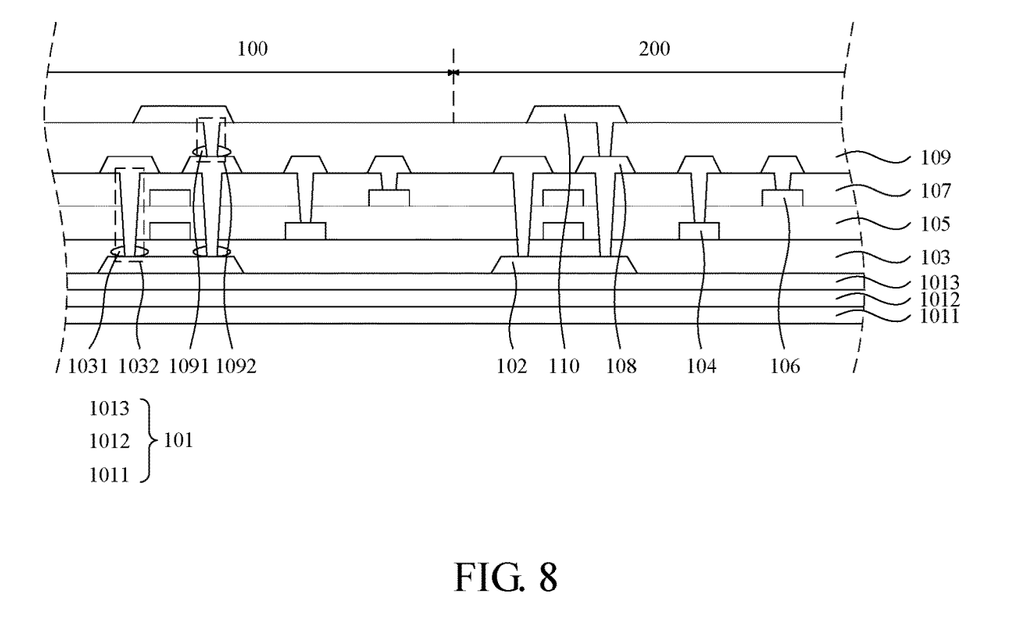
FIG. 8 is an eighth structural schematic diagram of the array substrate provided by an embodiment of the present disclosure.

In an embodiment, the hollowing-out regions are disposed in the first gate insulating layer 103 and the passivation layer 109. As illustrated in FIG. 8, the first hollowing-out region 1031 is disposed in the first gate insulating layer 103, and the fourth hollowing-out region 1091 is disposed in the passivation layer 109. The first hollowing-out region 1031 encircles the first via hole 1032, and the fourth hollowing-out region 1091 encircles the fourth via hole 1092. The source/drain electrode layer 108 is connected to the active layer 102 through the first via hole 1032, and the pixel electrode layer 110 is connected to the source/drain electrode layer 108 through the fourth via hole 1092.

This embodiment provides the hollowing-out regions in the first gate insulating layer and the passivation layer. When the flexible display panel is bent, the hollowing-out region in the first gate insulating layer provides a good channel for releasing stress in the first gate insulating layer, and the hollowing-out region in the passivation layer provides a good channel for releasing stress in the passivation layer, which prevent the problem of fragmentation and cracks from occurring in the first gate insulating layer or the passivation layer incurred by the stress unable to be released timely, resulting in damage to the structure of the entire panel, as well as improve the bending performance of the flexible display panel.

Figure 9:
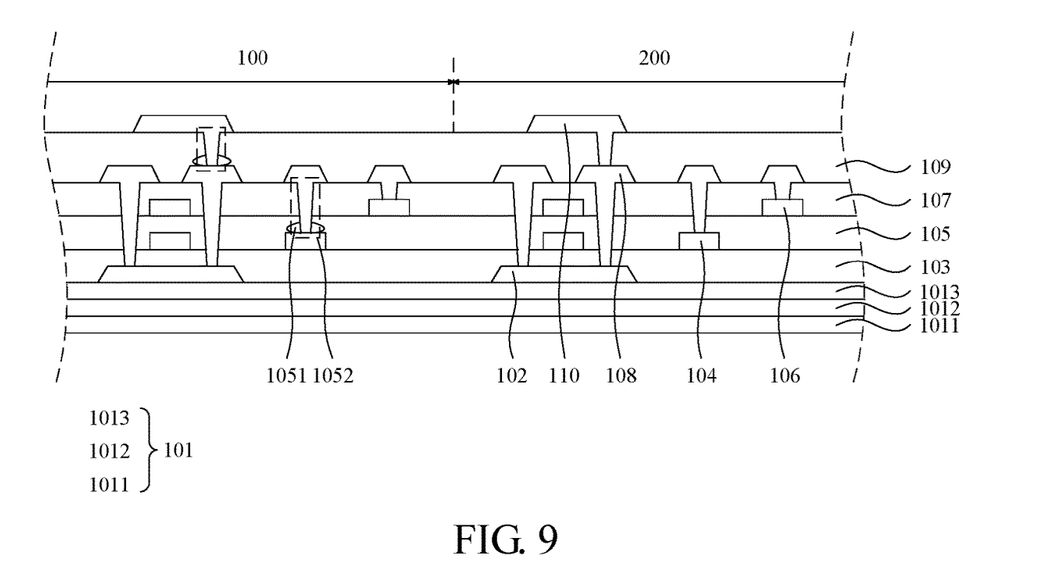
FIG. 9 is a ninth structural schematic diagram of the array substrate provided by an embodiment of the present disclosure.

In an embodiment, the hollowing-out regions are disposed in the second gate insulating layer 105 and the passivation layer 109. As illustrated in FIG. 9, the second hollowing-out region 1051 is disposed in the second gate insulating layer 105, and the fourth hollowing-out region 1091 is disposed in the passivation layer 109. The second hollowing-out region 1051 encircles the second via hole 1052, and the fourth hollowing-out region 1091 encircles the fourth via hole 1092. The source/drain electrode layer 108 is connected to the first gate electrode layer 104 through the second via hole 1052, and the pixel electrode layer 110 is connected to the source/drain electrode layer 108 through the fourth via hole 1092.

This embodiment provides the hollowing-out regions in the second gate insulating layer and the passivation layer. When the flexible display panel is bent, the hollowing-out region in the second gate insulating layer provides a good channel for releasing stress in the second gate insulating layer, and the hollowing-out region in the passivation layer provides a good channel for releasing stress in the passivation layer, which prevent the problem of fragmentation and cracks from occurring in the second gate insulating layer or the passivation layer incurred by the stress unable to be released timely, resulting in damage to the structure of the entire panel, as well as improve the bending performance of the flexible display panel.

Figure 10:
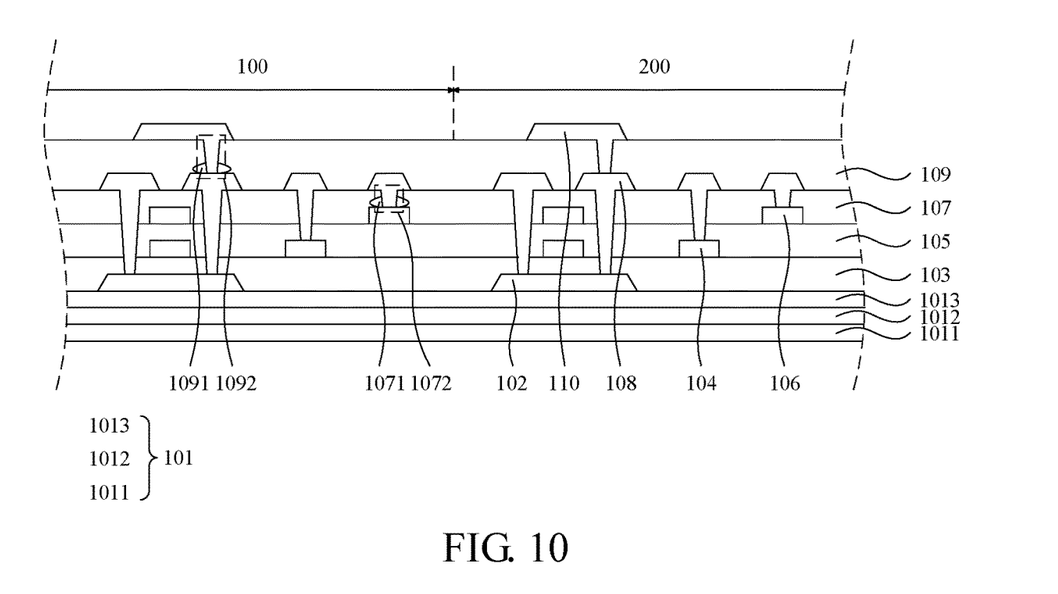
FIG. 10 is a tenth structural schematic diagram of the array substrate provided by an embodiment of the present disclosure.

In an embodiment, the hollowing-out regions are disposed in the interlayer insulation layer 107 and the passivation layer 109. As illustrated in FIG. 10, the third hollowing-out region 1071 is disposed in the interlayer insulation layer 107, and the fourth hollowing-out region 1091 is disposed in the passivation layer 109. The third hollowing-out region 1071 encircles the third via hole 1072, and the fourth hollowing-out region 1091 encircles the fourth via hole 1092. The source/drain electrode layer 108 is connected to the second gate electrode layer 106 through the third via hole 1072, and the pixel electrode layer 110 is connected to the source/drain electrode layer 108 through the fourth via hole 1092.

This embodiment provides the hollowing-out regions in the interlayer insulation layer and the passivation layer. When the flexible display panel is bent, the hollowing-out region in the interlayer insulation layer provides a good channel for releasing stress in the interlayer insulation layer, and the hollowing-out region in the passivation layer provides a good channel for releasing stress in the passivation layer, which prevent the problem of fragmentation and cracks from occurring in the interlayer insulation layer or the passivation layer incurred by the stress unable to be released timely, resulting in damage to the structure of the entire panel, as well as improve the bending performance of the flexible display panel.

The inorganic layer of the present disclosure disposed with hollowing-out regions can further include three layers.

Figure 11:
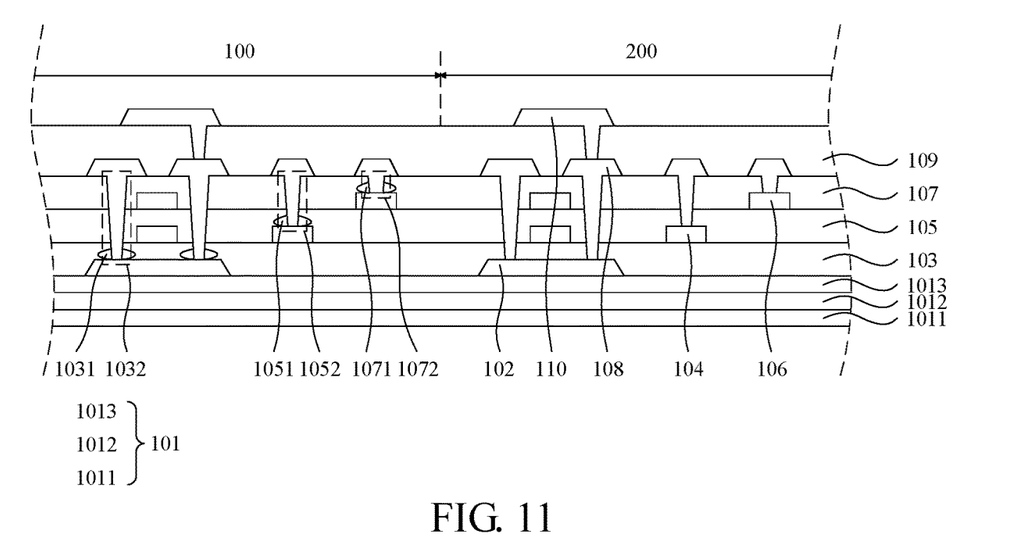
FIG. 11 is an eleventh structural schematic diagram of the array substrate provided by an embodiment of the present disclosure.

In an embodiment, the hollowing-out regions are disposed in the first gate insulating layer 103, the second gate insulating layer 105, and the interlayer insulation layer 107. As illustrated in FIG. 11, the first hollowing-out region 1031 is disposed in the first gate insulating layer 103, the second hollowing-out region 1051 is disposed in the second gate insulating layer 105, and the third hollowing-out region 1071 is disposed in the interlayer insulation layer 107. The first hollowing-out region 1031 encircles the first via hole 1032, the second hollowing-out region 1051 encircles the second via hole 1052, and the third hollowing-out region 1071 encircles the third via hole 1072. The source/drain electrode layer 108 is connected to the active layer 102 through the first via hole 1032, connected to the first gate electrode layer 104 through the second via hole 1052, and connected to the second gate electrode layer 106 through the third via hole 1072.

This embodiment provides the hollowing-out regions in the first gate insulating layer, the second gate insulating layer, and the interlayer insulation layer. When the flexible display panel is bent, the hollowing-out region in the first gate insulating layer provides a good channel for releasing stress in the first gate insulating layer, the hollowing-out region in the second gate insulating layer provides a good channel for releasing stress in the second gate insulating layer, and the hollowing-out region in the interlayer insulation layer provides a good channel for releasing stress in the interlayer insulation layer, which prevent the problem of fragmentation and cracks from occurring in the first gate insulating layer, the second gate insulating layer, or the interlayer insulation layer incurred by the stress unable to be released timely, resulting in damage to the structure of the entire panel, as well as improve the bending performance of the flexible display panel.

Figure 12:
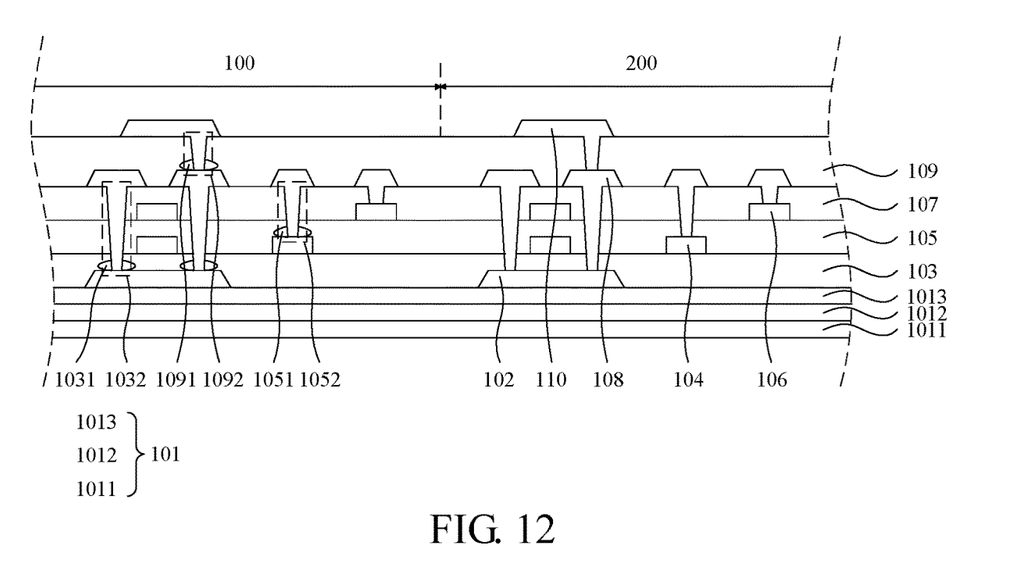
FIG. 12 is a twelfth structural schematic diagram of the array substrate provided by an embodiment of the present disclosure.

In an embodiment, the hollowing-out regions are disposed in the first gate insulating layer 103, the second gate insulating layer 105, and the passivation layer 109. As illustrated in FIG. 12, the first hollowing-out region 1031 is disposed in the first gate insulating layer 103, the second hollowing-out region 1051 is disposed in the second gate insulating layer 105, and the fourth hollowing-out region 1091 is disposed in the passivation layer 109. The first hollowing-out region 1031 encircles the first via hole 1032, the second hollowing-out region 1051 encircles a second via hole 1052, and the fourth hollowing-out region 1091 encircles the fourth via hole 1092. The source/drain electrode layer 108 is connected to the active layer 102 through the first via hole 1032 and connected to the first gate electrode layer 104 through the second via hole 1052, and the pixel electrode layer 110 is connected to the source/drain electrode layer 108 through the fourth via hole 1092.

This embodiment provides the hollowing-out regions in the first gate insulating layer, the second gate insulating layer, and the passivation layer. When the flexible display panel is bent, the hollowing-out region in the first gate insulating layer provides a good channel for releasing stress in the first gate insulating layer, the hollowing-out region in the second gate insulating layer provides a good channel for releasing stress in the second gate insulating layer, and the hollowing-out region in the passivation layer provides a good channel for releasing stress in the passivation layer, which prevent the problem of fragmentation and cracks from occurring in the first gate insulating layer, the second gate insulating layer, or the passivation layer incurred by the stress unable to be released timely, resulting in damage to the structure of the entire panel, as well as improve the bending performance of the flexible display panel.

Figure 13:
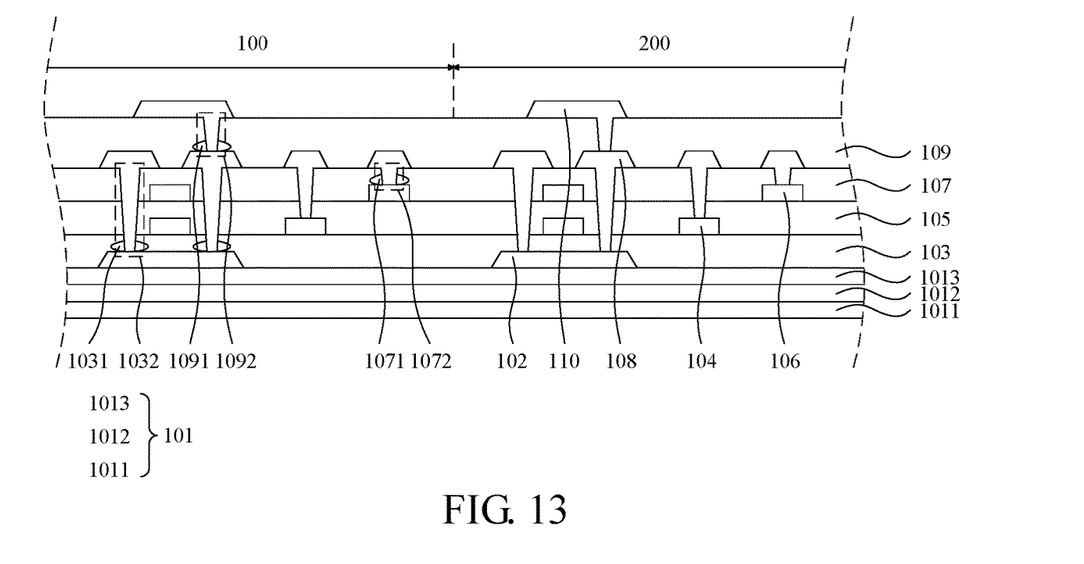
FIG. 13 is a thirteenth structural schematic diagram of the array substrate provided by an embodiment of the present disclosure.

In an embodiment, the hollowing-out regions are disposed in the first gate insulating layer 103, the interlayer insulation layer 107, and the passivation layer 109. As illustrated in FIG. 13, the first hollowing-out region 1031 is disposed in the first gate insulating layer 103, the third hollowing-out region 1071 is disposed in the interlayer insulation layer 107, and the fourth hollowing-out region 1091 is disposed in the passivation layer 109. The first hollowing-out region 1031 encircles the first via hole 1032, the third hollowing-out region 1071 encircles the third via hole 1072, and the fourth hollowing-out region 1091 encircles the fourth via hole 1092. The source/drain electrode layer 108 is connected to the active layer 102 through the first via hole 1032 and connected to the second gate electrode layer 106 through the third via hole 1072, and the pixel electrode layer 110 is connected to the source/drain electrode layer 108 through the fourth via hole 1092.

This embodiment provides the hollowing-out regions in the first gate insulating layer, the interlayer insulation layer, and the passivation layer. When the flexible display panel is bent, the hollowing-out region in the first gate insulating layer provides a good channel for releasing stress in the first gate insulating layer, the hollowing-out region in the interlayer insulation layer provides a good channel for releasing stress in the interlayer insulation layer, and the hollowing-out region in the passivation layer provides a good channel for releasing stress in the passivation layer, which prevent the problem of fragmentation and cracks from occurring in the first gate insulating layer, the interlayer insulation layer, or the passivation layer incurred by the stress unable to be released timely, resulting in damage to the structure of the entire panel, as well as improve the bending performance of the flexible display panel.

Figure 14:
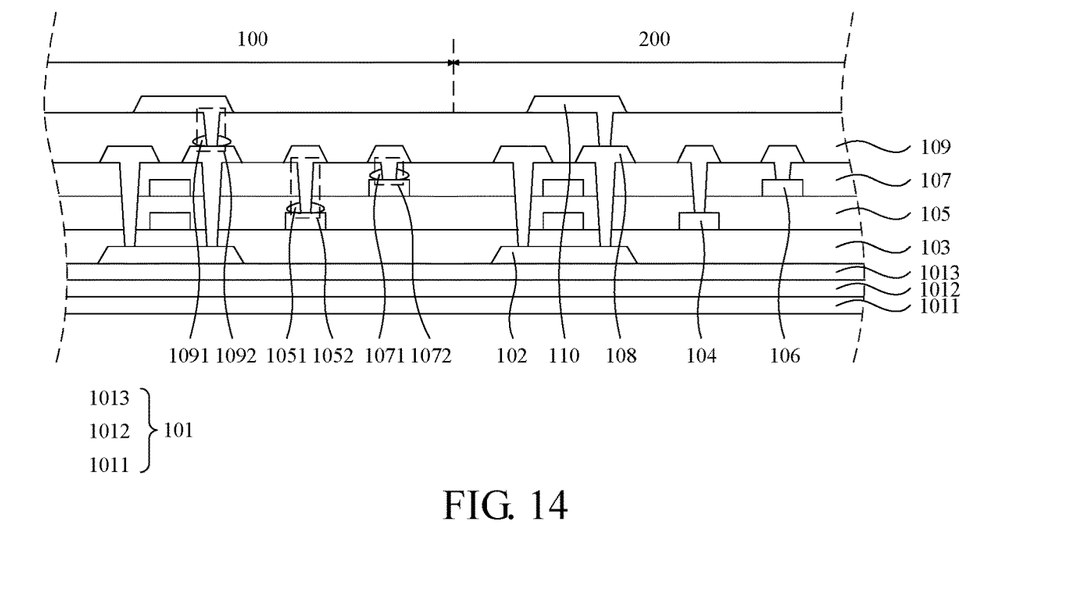
FIG. 14 is a fourteenth structural schematic diagram of the array substrate provided by an embodiment of the present disclosure.

In an embodiment, the hollowing-out regions are disposed in the second gate insulating layer 105, the interlayer insulation layer 107, and the passivation layer 109. As illustrated in FIG. 14, the second hollowing-out region 1051 is disposed in the second gate insulating layer 105, the third hollowing-out region 1071 is disposed in the interlayer insulation layer 107, and the fourth hollowing-out region 1091 is disposed in the passivation layer 109. The second hollowing-out region 1051 encircles the second via hole 1052, the third hollowing-out region 1071 encircles the third via hole 1072, and the fourth hollowing-out region 1091 encircles the fourth via hole 1092. The source/drain electrode layer 108 is connected to the first gate electrode layer 104 through the second via hole 1052 and connected to the second gate electrode layer 106 through the third via hole 1072, and the pixel electrode layer 110 is connected to the source/drain electrode layer 108 through the fourth via hole 1092.

This embodiment provides the hollowing-out regions in the second gate insulating layer, the interlayer insulation layer, and the passivation layer. When the flexible display panel is bent, the hollowing-out region in the second gate insulating layer provides a good channel for releasing stress in the second gate insulating layer, the hollowing-out region in the interlayer insulation layer provides a good channel for releasing stress in the interlayer insulation layer, and the hollowing-out region in the passivation layer provides a good channel for releasing stress in the passivation layer, which prevent the problem of fragmentation and cracks from occurring in the second gate insulating layer, the interlayer insulation layer, or the passivation layer incurred by the stress unable to be released timely, resulting in damage to the structure of the entire panel, as well as improve the bending performance of the flexible display panel.

The inorganic layer of the present disclosure disposed with a hollowing-out region can further include four layers.

Figure 15:
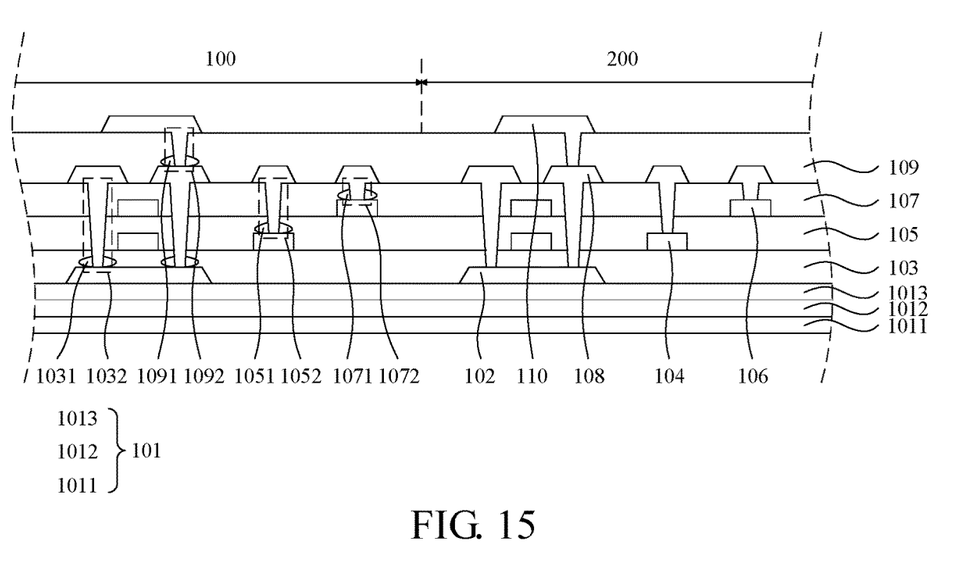
FIG. 15 is a fifteenth structural schematic diagram of the array substrate provided by an embodiment of the present disclosure.

In an embodiment, the hollowing-out regions are disposed in the first gate insulating layer 103, the second gate insulating layer 105, the interlayer insulation layer 107, and the passivation layer 109. As illustrated in FIG. 15, the first hollowing-out region 1031 is disposed in the first gate insulating layer 103, the second hollowing-out region 1051 is disposed in the second gate insulating layer 105, the third hollowing-out region 1071 is disposed in the interlayer insulation layer 107, and the fourth hollowing-out region 1091 is disposed in the passivation layer 109. The first hollowing-out region 1031 encircles the first via hole 1032, the second hollowing-out region 1051 encircles the second via hole 1052, the third hollowing-out region 1071 encircles the third via hole 1072, and the fourth hollowing-out region 1091 encircles the fourth via hole 1092. The source/drain electrode layer 108 is connected to the active layer 102 through the first via hole 1032, connected to the first gate electrode layer 104 through the second via hole 1052, and connected to the second gate electrode layer 106 through the third via hole 1072, and the pixel electrode layer 110 is connected to the source/drain electrode layer 108 through the fourth via hole 1092.

This embodiment provides the hollowing-out regions in the first gate insulating layer, the second gate insulating layer, the interlayer insulation layer, and the passivation layer. When the flexible display panel is bent, the hollowing-out region in the first gate insulating layer provides a good channel for releasing stress in the first gate insulating layer, the hollowing-out region in the second gate insulating layer provides a good channel for releasing stress in the second gate insulating layer, the hollowing-out region in the interlayer insulation layer provides a good channel for releasing stress in the interlayer insulation layer, and the hollowing-out region in the passivation layer provides a good channel for releasing stress in the passivation layer, which prevent the problem of fragmentation and cracks from occurring in the first gate insulating layer, the second gate insulating layer, the interlayer insulation layer, or the passivation layer incurred by the stress unable to be released timely, resulting in damage to the structure of the entire panel, as well as improve the bending performance of the flexible display panel.

Meanwhile, the present disclosure further provides a flexible display panel. The flexible display panel includes an array substrate, and the array substrate is in a bending region and includes:

a base;

an inorganic layer formed on the base, wherein at least one hollowing-out region is disposed in the inorganic layer, and the at least one hollowing-out region is non-filled or filled with an organic matter.

a metal layer formed on the inorganic layer and connected to layers on a bottom of the inorganic layer by at least one via hole encircled by the at least one hollowing-out region.

This embodiment provides the flexible display panel. The flexible display panel includes the array substrate. The array substrate is provided with the hollowing-out region in the inorganic layer of the bending region, and the hollowing-out region is non-filled or filled with an organic matter. When the flexible display panel is bent, the at least one hollowing-out region provides a good channel for releasing stress in the inorganic layer, which prevents the problem of fragmentation and cracks from occurring in the inorganic layer incurred by the stress unable to be released timely, resulting in damage to the structure of the entire panel, as well as improves the bending performance of the flexible display panel.

In an embodiment, the inorganic layer only includes only one layer.

In an embodiment, the inorganic layer is any layer of a first gate insulating layer, a second gate insulating layer, or an interlayer insulation layer, and the metal layer is a source/drain electrode layer.

In an embodiment, the inorganic layer is a passivation layer, and the metal layer is a pixel electrode layer.

In an embodiment, the inorganic layer includes at least two layers.

In an embodiment, the inorganic layer includes any two layers of a first gate insulating layer, a second gate insulating layer, and an interlayer insulation layer, and the metal layer is a source/drain electrode layer.

In an embodiment, the inorganic layer includes a first inorganic layer and a second inorganic layer, and the metal layer includes a first metal layer and a second metal layer. The first metal layer, the second inorganic layer, and the second metal layer are sequentially formed on the first inorganic layer. The first inorganic layer is any layer of a first gate insulating layer, a second gate insulating layer, or an interlayer insulation layer. The first metal layer is a source/drain electrode layer. The second inorganic layer is a passivation layer. The second metal layer is a pixel electrode layer.

In an embodiment, the inorganic layer includes a first gate insulating layer, a second gate insulating layer, and an interlayer insulation layer, and the metal layer is a source/drain electrode layer.

In an embodiment, the inorganic layer includes a first inorganic layer and a second inorganic layer, and the metal layer includes a first metal layer and a second metal layer. The first metal layer, the second inorganic layer, and the second metal layer are sequentially formed on the first inorganic layer. The first inorganic layer includes any two of a first gate insulating layer, a second gate insulating layer, and an interlayer insulation layer. The first metal layer is a source/drain electrode layer. The second inorganic layer is a passivation layer. The second metal layer is a pixel electrode layer.

In an embodiment, the inorganic layer includes the first inorganic layer and the second inorganic layer, and the metal layer includes the first metal layer and the second metal layer. The first metal layer, the second inorganic layer, and the second metal layer are sequentially formed on the first inorganic layer. The first inorganic layer includes the first gate insulating layer, the second gate insulating layer, and the interlayer insulation layer. The first metal layer is the source/drain electrode layer. The second inorganic layer is the passivation layer. The second metal layer is the pixel electrode layer.

According to embodiments mentioned above:

The present disclosure provides an array substrate and a flexible display panel. The array substrate is in a bending region and includes a base; an inorganic layer formed on the base, wherein at least one hollowing-out region is disposed in the inorganic layer, and the hollowing-out region is non-filled or filled with an organic matter; and a metal layer formed on the inorganic layer and connected to layers on a bottom of the inorganic layer by at least one via hole encircled by the at least one hollowing-out region. By disposing the hollowing-out region in the inorganic layer, wherein the hollowing-out region is non-filled or filled with an organic matter, when the flexible display panel is bent, the at least one hollowing-out region provides a good channel for releasing stress in the inorganic layer, which prevents the problem of fragmentation and cracks from occurring in the inorganic layer incurred by the stress unable to be released timely, resulting in damage to the structure of the entire panel, as well as improves the bending performance of the flexible display panel.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. An array substrate, wherein the array substrate is in a bending region and comprises:
   a base;
   an inorganic layer formed on the base, wherein at least one hollowing-out region is disposed in the inorganic layer, and the hollowing-out region is non-filled or filled with an organic matter; and
   a metal layer formed on the inorganic layer and connected to layers on a bottom of the inorganic layer by at least one via hole encircled by the at least one hollowing-out region;
   wherein the inorganic layer comprises at least two layers,
   wherein the inorganic layer comprises a first inorganic layer and a second inorganic layer, the metal layer comprises a first metal layer and a second metal layer, the first metal layer, the second inorganic layer, and the second metal layer are sequentially formed on the first inorganic layer, the first inorganic layer is any layer of a first gate insulating layer, a second gate insulating layer, or an interlayer insulation layer, the first metal layer is a source/drain electrode layer, the second inorganic layer is a passivation layer, and the second metal layer is a pixel electrode layer.

2. The array substrate as claimed in claim 1, wherein the inorganic layer comprises any two of a first gate insulating layer, a second gate insulating layer, and an interlayer insulation layer, and the metal layer is a source/drain electrode layer.

3. The array substrate as claimed in claim 2, wherein the inorganic layer comprises a first inorganic layer and a second inorganic layer, the metal layer comprises a first metal layer and a second metal layer, the first metal layer, the second inorganic layer, and the second metal layer are sequentially formed on the first inorganic layer, the first inorganic layer comprises any two of a first gate insulating layer, a second gate insulating layer, and an interlayer insulation layer, the first metal layer is a source/drain electrode layer, the second inorganic layer is a passivation layer, and the second metal layer is a pixel electrode layer.

4. The array substrate as claimed in claim 2, wherein the inorganic layer comprises a first inorganic layer and a second inorganic layer, the metal layer comprises a first metal layer and a second metal layer, the first metal layer, the second inorganic layer, and the second metal layer are sequentially formed on the first inorganic layer, the first inorganic layer comprises a first gate insulating layer, a second gate insulating layer, and an interlayer insulation layer, the first metal layer is a source/drain electrode layer, the second inorganic layer is a passivation layer, and the second metal layer is a pixel electrode layer.

5. The array substrate as claimed in claim 1, wherein the inorganic layer comprises a first gate insulating layer, a second gate insulating layer, and an interlayer insulation layer, and the metal layer is a source/drain electrode layer.

6. A flexible display panel, comprising an array substrate, wherein the array substrate is in a bending region and comprises:
   a base;
   an inorganic layer formed on the base, wherein at least one hollowing-out region is disposed in the inorganic layer, and the hollowing-out region is non-filled or filled with an organic matter; and a metal layer formed on the inorganic layer and connected to layers on a bottom of the inorganic layer by at least one via hole encircled by the at least one hollowing-out region;

wherein the inorganic layer comprises at least two layers, wherein the inorganic layer comprises a first inorganic layer and a second inorganic layer, the metal layer comprises a first metal layer and a second metal layer, the first metal layer, the second inorganic layer, and the second metal layer are sequentially formed on the first inorganic layer, the first inorganic layer is any layer of a first gate insulating layer, a second gate insulating layer, or an interlayer insulation layer, the first metal layer is a source/drain electrode layer, the second inorganic layer is a passivation layer, and the second metal layer is a pixel electrode layer.

7. The flexible display panel as claimed in claim 6, wherein the inorganic layer comprises any two of a first gate insulating layer, a second gate insulating layer, and an interlayer insulation layer, and the metal layer is a source/drain electrode layer.

8. The flexible display panel as claimed in claim 7, wherein the inorganic layer comprises a first inorganic layer and a second inorganic layer, the metal layer comprises a first metal layer and a second metal layer, the first metal layer, the second inorganic layer, and the second metal layer are sequentially formed on the first inorganic layer, the first inorganic layer comprises any two of a first gate insulating layer, a second gate insulating layer, and an interlayer insulation layer, the first metal layer is a source/drain electrode layer, the second inorganic layer is a passivation layer, and the second metal layer is a pixel electrode layer.

9. The flexible display panel as claimed in claim 7, wherein the inorganic layer comprises a first inorganic layer and a second inorganic layer, the metal layer comprises a first metal layer and a second metal layer, the first metal layer, the second inorganic layer, and the second metal layer are sequentially formed on the first inorganic layer, the first inorganic layer comprises a first gate insulating layer, a second gate insulating layer, and an interlayer insulation layer, the first metal layer is a source/drain electrode layer, the second inorganic layer is a passivation layer, and the second metal layer is a pixel electrode layer.

10. The flexible display panel as claimed in claim 6, wherein the inorganic layer comprises a first gate insulating layer, a second gate insulating layer, and an interlayer insulation layer, and the metal layer is a source/drain electrode layer.

* * * * *